United States Patent
Kim et al.

(10) Patent No.: US 8,324,696 B2
(45) Date of Patent: Dec. 4, 2012

(54) ULTRAFAST MAGNETIC RECORDING ELEMENT AND NONVOLATILE MAGNETIC RANDOM ACCESS MEMORY USING THE MAGNETIC RECORDING ELEMENT

(75) Inventors: Sang-Koog Kim, Seoul (KR); Ki-Suk Lee, Seoul (KR); Young-Sang Yu, Seoul (KR)

(73) Assignee: SNU R&DB Foundation, Seoul (KR)

( * ) Notice: Subject to any disclaimer, the term of this patent is extended or adjusted under 35 U.S.C. 154(b) by 284 days.

(21) Appl. No.: 12/738,652

(22) PCT Filed: Oct. 17, 2008

(86) PCT No.: PCT/KR2008/006138
§ 371 (c)(1),
(2), (4) Date: Apr. 19, 2010

(87) PCT Pub. No.: WO2009/051435
PCT Pub. Date: Apr. 23, 2009

(65) Prior Publication Data
US 2010/0207220 A1   Aug. 19, 2010

(30) Foreign Application Priority Data

Oct. 19, 2007   (KR) ................. 10-2007-0105580
Oct. 19, 2007   (KR) ................. 10-2007-0105596

(51) Int. Cl.
*H01L 29/82* (2006.01)

(52) U.S. Cl. ............... 257/421; 257/427; 257/E29.323; 438/3; 365/157; 360/324.2

(58) Field of Classification Search .......... 257/421–427, 257/E29.323; 438/3; 360/324–326; 365/157–158
See application file for complete search history.

(56) References Cited

U.S. PATENT DOCUMENTS

| | | | |
|---|---|---|---|
| 3,150,269 A * | 9/1964 | Vogl, Jr. ................. | 307/415 |
| 5,869,963 A * | 2/1999 | Saito et al. ............. | 324/252 |
| 6,269,018 B1 * | 7/2001 | Monsma et al. ....... | 365/145 |
| 2006/0056114 A1 | 3/2006 | Fukumoto et al. | |

(Continued)

FOREIGN PATENT DOCUMENTS

CN   2006-10072797   * 10/2007

(Continued)

OTHER PUBLICATIONS

International Search Report: PCT/KR2008/006138.

*Primary Examiner* — Jami M Valentine
(74) *Attorney, Agent, or Firm* — Ladas & Parry LLP

(57) ABSTRACT

Provided are an ultrafast magnetic recording element and a nonvolatile magnetic random access memory using the same. The magnetic recording element includes a read electrode, a magnetic pinned layer formed on the read electrode, and an insulating layer or a conductive layer formed on the magnetic pinned layer. The magnetic recording element includes a magnetic free layer formed on the insulating layer or the conductive layer, in which a magnetic vortex is formed, and a plurality of drive electrodes applying a current or magnetic field to the magnetic free layer. According to the magnetic recording elements, the magnetic recording element with a simple structure can be realized using a magnetic layer with a magnetic vortex formed, and the magnetic recording element can be accurately driven with low power using a plurality of drive electrodes.

6 Claims, 4 Drawing Sheets

U.S. PATENT DOCUMENTS

2009/0180311 A1 7/2009 Ono et al.
2009/0273972 A1* 11/2009 Han et al. ..................... 365/173

FOREIGN PATENT DOCUMENTS

| | | |
|---|---|---|
| EP | 1 622 161 A2 | 2/2006 |
| JP | 2002-175623 A | 6/2002 |
| JP | 2004-139681 A | 5/2004 |
| KR | 1999-029127 A | 4/1999 |
| KR | 2007-0036673 A | 4/2007 |
| WO | 2007/105358 A1 | 9/2007 |
| WO | 2009/051441 A1 | 4/2009 |
| WO | 2009/051442 A2 | 4/2009 |

* cited by examiner

[Fig. 1]
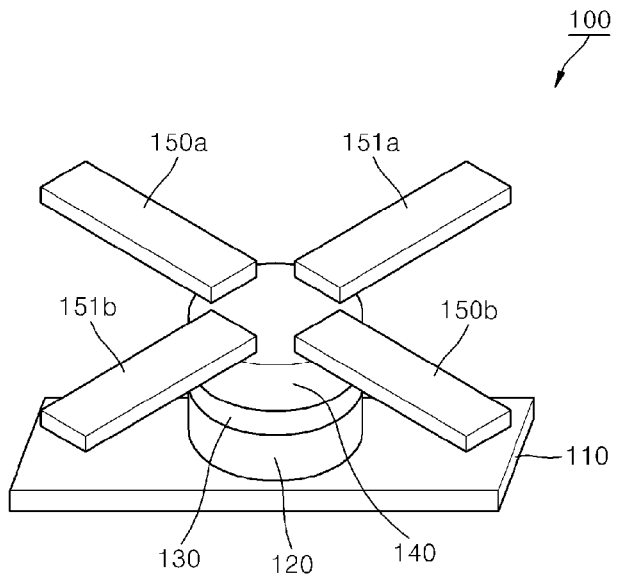
[Fig. 2]
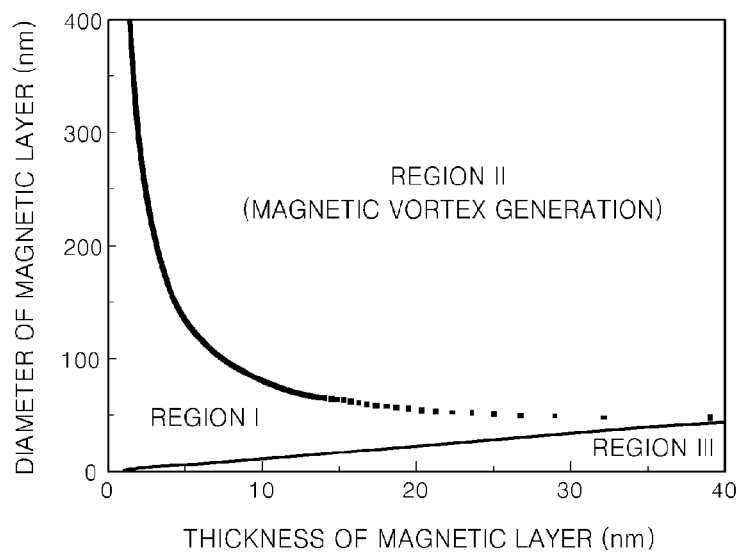
[Fig. 3]
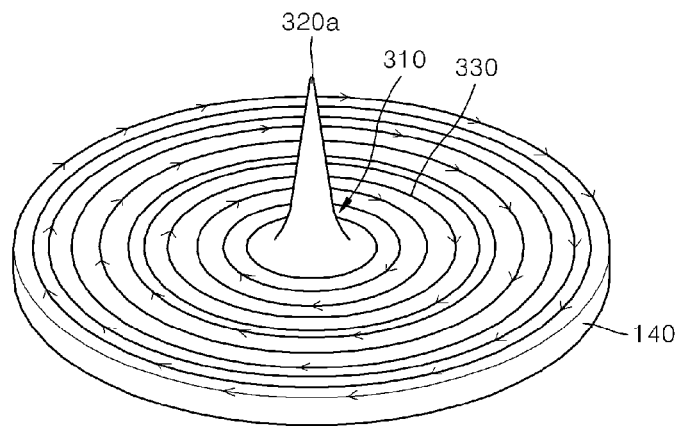

[Fig. 4]
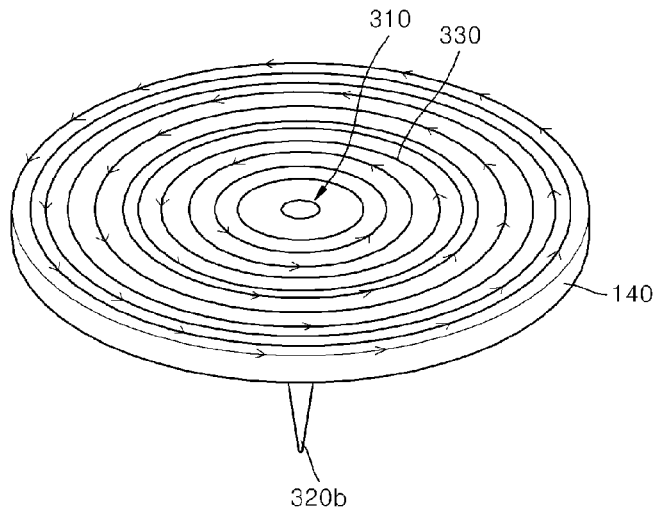
[Fig. 5]
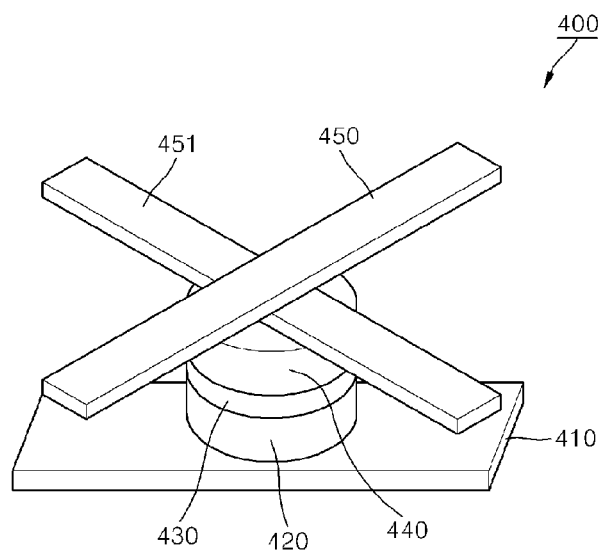
[Fig. 6]
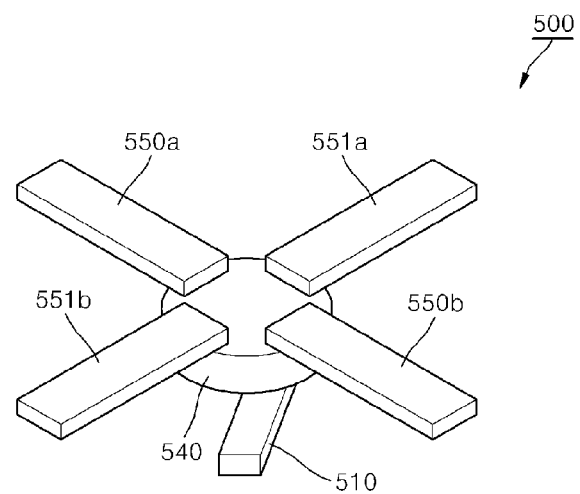

[Fig. 7]
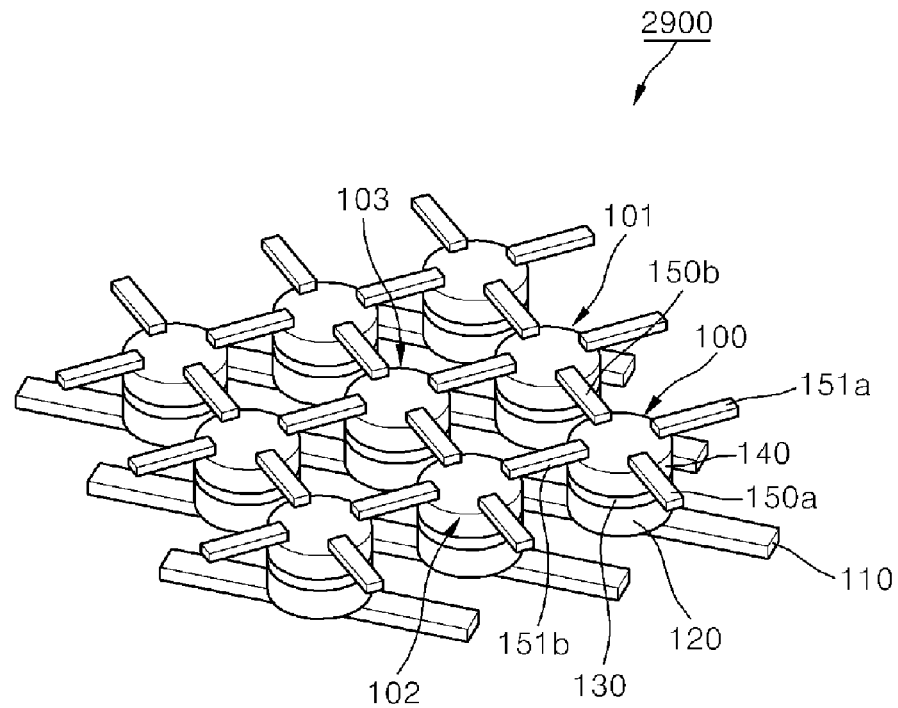
[Fig. 8]
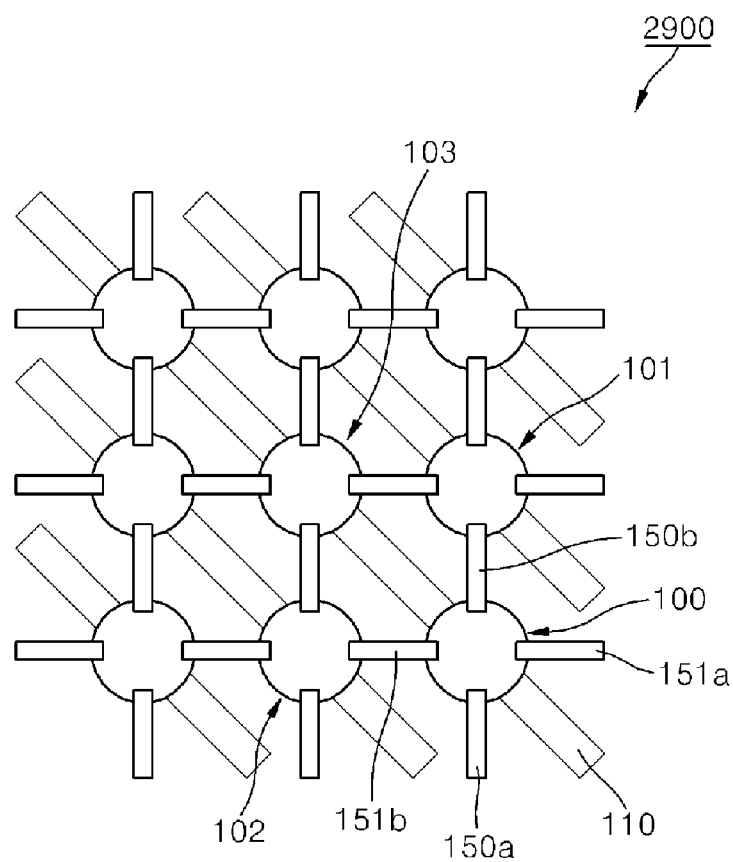

[Fig. 9]
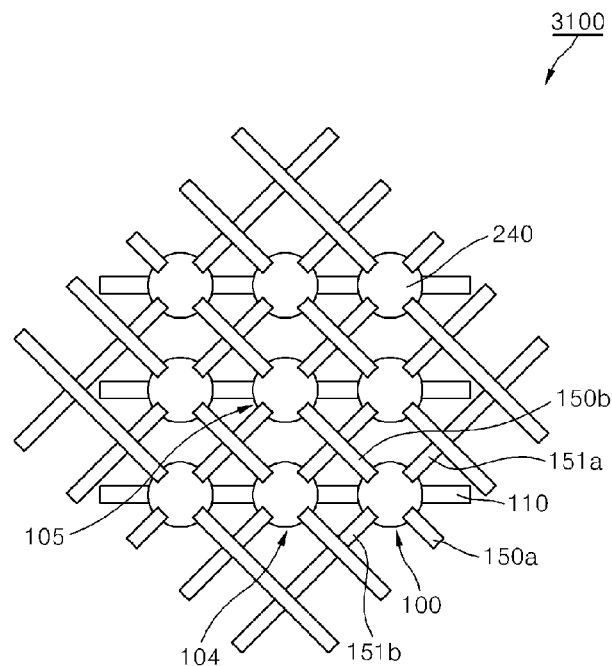
[Fig. 10]
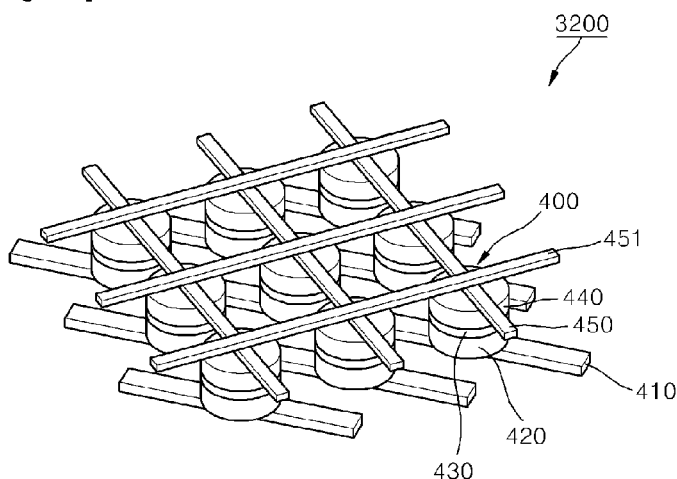
[Fig. 11]
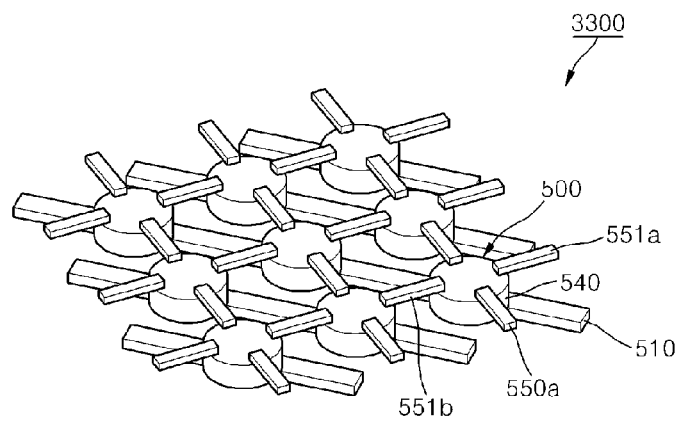

ULTRAFAST MAGNETIC RECORDING ELEMENT AND NONVOLATILE MAGNETIC RANDOM ACCESS MEMORY USING THE MAGNETIC RECORDING ELEMENT

TECHNICAL FIELD

The present invention relates to a magnetic recording element available in a nonvolatile random access memory, and more particularly, to a magnetic recording element using a magnetic vortex existing in a magnetic layer of a few micrometers in size.

Background Art

In line with remarkable developments in an information and telecommunication field, there is an increasing demand for various kinds of memory devices. In particular, nonvolatile memory devices, which can retain data even if power is turned off, are demanded as memory devices available for mobile terminals, MP3 players, or the like. Since nonvolatile memory devices can electrically program and erase data, and retain data even though power is not supplied, they are increasingly applied to a variety of fields at present. However, typical dynamic random access memories (DRAMs) are volatile memory devices, and thus lose stored data when power is not supplied. Therefore, many studies are being conducted on nonvolatile memory devices which can be used in place of DRAMs.

Among various kinds of nonvolatile memory devices, researches are mainly being made on a phase RAM (PRAM) using a phase transition phenomenon, a magnetic RAM (MRAM) using a magnetoresistance, a ferroelectric RAM (FRAM) using a ferroelectric effect, and a resistance RAM (ReRAM) using a resistance switching or conductivity switching phenomenon of a metal oxide thin film. In particular, much attention has been paid on MRAMs recently because MRAMs have an operation speed faster than other nonvolatile memory devices, and excellent durability against the repetitive use.

MRAMs are classified into two memories according to a method for read-out of information, of which one is an MRAM using giant magnetoresistance (GMR) effect and the other is an MRAM using tunneling magnetoresistance (TMR) effect. Since the MRAM using the GMR effect has the magnetoresistance less than 10%, a reading speed of information is slow and a signal-to-noise ratio (SNR) is low. Also, the MRAM using the GMR effect may be affected by a magnetic field applied to adjacent magnetic recording elements, and thus the magnetic recording elements should be spaced apart from each other by a predetermined distance or more, leading to a difficulty in achieving high integration.

The MRAM using the TMR effect has a magnetic tunnel junction (MTJ) structure as a basic structure. The MTJ structure is a stack structure where a read electrode, an antiferromagnetic layer, a magnetic pinned layer formed of a ferromagnetic material, an insulating layer, a magnetic free layer formed of a ferromagnetic material, and a drive electrode are formed over a substrate in sequence. Like the MRAM using the GMR effect, the MRAM using the TMR effect stores information using a magnetoresistance difference according to a relative difference in magnetization direction between the magnetic free layer and the magnetic pinned layer. Unlike the MRAM using the GMR effect, however, the MRAM using the TMR effect has a faster reproduction rate and a higher SNR than the MRAM using the GMR effect because it has the magnetoresistance of 20% or more.

In the MRAM using the TMR effect, the resistance of each magnetic recording element greatly varies with a thickness of an insulating layer. Accordingly, information is stored by the use of a resistance difference from an adjacent comparative magnetic recording element at present. If, however, a thickness difference between an insulating layer of a storage magnetic recording element and an insulating layer of a comparative magnetic recording element is 0.2 Å or greater, it is difficult to read out information stored in the magnetic recording element. Therefore, there is a technical problem in that an insulating layer should be conformally formed over a wafer of several inches in radius during a manufacturing process.

As the magnetic recording element shrinks in size, the magnetic free layer and the magnetic pinned layer get close to each other. Therefore, a ferromagnet of the magnetic free layer is affected by a magnetic field of a ferromagnet of the magnetic pinned layer. Such a magnetic field produced by the magnetic pinned layer, that is, a stray field, may have a detrimental effect, for example, a decrease in magnetoresistance, or an increase in coercive force of the magnetic free layer. Especially, the insulating layer in the MTJ structure is thinner than the conductive layer of the MRAM using the GMR effect because the MTJ structure makes use of the TMR effect. Consequently, the magnetic free layer and the magnetic pinned layer get closer and closer to each other, and thus the magnetization of the magnetic free layer is greatly affected by the magnetic pinned layer.

DISCLOSURE OF INVENTION

Technical Problem

The present invention provides a magnetic recording element using a magnetic vortex and a nonvolatile magnetic random access memory using the magnetic recording element, which can realize low power consumption and simple and convenient use characteristics, can write and read information within several nanoseconds or less, and can achieve high degree of integration above several Giga bytes per square inches so as to be applicable to an actual magnetic random access memory (MRAM).

Technical Solution

According to an exemplary embodiment, a magnetic recording element includes: a read electrode; a magnetic pinned layer formed on the read electrode; an insulating layer formed on the magnetic pinned layer; a magnetic free layer formed on the insulating layer, in which a magnetic vortex is formed; and a plurality of drive electrode pairs disposed to form an ohmic contact with the magnetic free layer.

According to another exemplary embodiment, a magnetic recording element includes: a read electrode; a magnetic pinned layer formed on the read electrode; a conductive layer formed on the magnetic pinned layer; a magnetic free layer formed on the conductive layer, in which a magnetic vortex is formed; and a plurality of drive electrode pairs disposed to form an ohmic contact with the magnetic free layer.

According to still another exemplary embodiment, a magnetic recording element includes: a read electrode; a magnetic pinned layer formed on the read electrode; an insulating layer formed on the magnetic pinned layer; a magnetic free layer formed on the insulating layer, in which a magnetic vortex is formed; and a plurality of drive electrodes formed on at least one of a top surface and undersurface of the magnetic free layer in a configuration to cross each other.

According to even another exemplary embodiment, a magnetic recording element includes: a read electrode; a magnetic pinned layer formed on the read electrode; a conductive layer formed on the magnetic pinned layer; a magnetic free layer formed on the conductive layer, in which a magnetic vortex is formed; and a plurality of drive electrodes formed on at least one of a top surface and undersurface of the magnetic free layer in a configuration to cross each other.

According to yet another exemplary embodiment, a magnetic recording element includes: a magnetic free layer in which a magnetic vortex is formed; a plurality of drive electrode pairs disposed to form an ohmic contact with the magnetic free layer; and a read line through which a current generated by a voltage induced by the movement of a magnetic vortex core flows, the read line being disposed around the magnetic free layer.

According to further exemplary embodiment, a magnetic recording element includes: a magnetic free layer in which a magnetic vortex is formed; a plurality of drive electrodes formed on at least one of a top surface and undersurface of the magnetic free layer in a configuration to cross each other; and a read line through which a current generated by a voltage induced by the movement of a magnetic vortex core flows, the read line being disposed around the magnetic free layer.

According to another exemplary embodiment, a magnetic random access memory (MRAM) includes magnetic recording elements arranged in rows and columns. Herein, the magnetic recording element includes: a read electrode; a magnetic pinned layer formed on the read electrode; an insulating layer formed on the magnetic pinned layer; a magnetic free layer formed on the insulating layer, in which a magnetic vortex is formed; and a plurality of drive electrode pairs disposed to form an ohmic contact with the magnetic free layer, wherein the respective magnetic recording elements form an array by sharing the drive electrode pairs and the read electrode with the magnetic recording elements adjacent thereto.

According to yet another exemplary embodiment, an MRAM includes magnetic recording elements arranged in rows and columns. Herein, the magnetic recording element includes: a read electrode; a magnetic pinned layer formed on the read electrode; a conductive layer formed on the magnetic pinned layer; a magnetic free layer formed on the conductive layer, in which a magnetic vortex is formed; and a plurality of drive electrode pairs disposed to form an ohmic contact with the magnetic free layer, wherein the respective magnetic recording elements form an array by sharing the drive electrode pairs and the read electrode with the magnetic recording elements adjacent thereto.

According to still another exemplary embodiment, an MRAM includes magnetic recording elements arranged in rows and columns. Herein, the magnetic recording element includes: a read electrode; a magnetic pinned layer formed on the read electrode; an insulating layer formed on the magnetic pinned layer; a magnetic free layer formed on the insulating layer, in which a magnetic vortex is formed; and a plurality of drive electrodes formed on at least one of a top surface and undersurface of the magnetic free layer in a configuration to cross each other, wherein the respective magnetic recording elements form an array by sharing the drive electrodes and the read electrode with the magnetic recording elements adjacent thereto.

According to even another exemplary embodiment, an MRAM includes magnetic recording elements arranged in rows and columns. Herein, the magnetic recording element includes: a read electrode; a magnetic pinned layer formed on the read electrode; a conductive layer formed on the magnetic pinned layer; a magnetic free layer formed on the conductive layer, in which a magnetic vortex is formed; and a plurality of drive electrodes formed on at least one of a top surface and undersurface of the magnetic free layer in a configuration to cross each other, wherein the respective magnetic recording elements form an array by sharing the drive electrodes and the read electrode with the magnetic recording elements adjacent thereto.

According to further exemplary embodiment, an MRAM includes magnetic recording elements arranged in rows and columns. Herein, the magnetic recording element includes: a magnetic free layer in which a magnetic vortex is formed; a plurality of drive electrode pairs disposed to form an ohmic contact with the magnetic free layer; and a read line through which a current generated by a voltage induced by the movement of a magnetic vortex core flows, the read line being disposed around the magnetic free layer, wherein the respective magnetic recording elements form an array by sharing the drive electrode pairs and the read electrode with the magnetic recording elements adjacent thereto.

According to yet further exemplary embodiment, an MRAM includes magnetic recording elements arranged in rows and columns. Herein, the magnetic recording element includes: a magnetic free layer in which a magnetic vortex is formed; a plurality of drive electrodes formed on at least one of a top surface and undersurface of the magnetic free layer in a configuration to cross each other; and a read line through which a current generated by a voltage induced by the movement of a magnetic vortex core flows, the read line being disposed around the magnetic free layer, wherein the respective magnetic recording elements form an array by sharing the drive electrodes and the read electrode with the magnetic recording elements adjacent thereto.

Advantageous Effects

According to a magnetic recording element in accordance with the present invention, a magnetic recording element having a simple structure can be realized using a magnetic layer with a magnetic vortex formed, and the magnetic recording element can be accurately driven with low power using a plurality of drive electrode pairs or a plurality of drive electrodes.

According to a magnetic random access memory (MRAM) in accordance with the present invention, it is possible to realize an MRAM having a simple structure, which can store and read information within several nanoseconds or less using a magnetic free layer with a magnetic vortex formed. In addition, the MRAM can be accurately driven with low power using a plurality of drive electrode pairs or a plurality of drive electrodes.

BRIEF DESCRIPTION OF THE DRAWINGS

Exemplary embodiments can be understood in more detail from the following description taken in conjunction with the accompanying drawings, in which:

FIG. 1 is a schematic perspective view of a magnetic recording element according to a first preferred embodiment of the present invention;

FIG. 2 is a graph showing a variation of magnetization state formed in a magnetic layer according to the thickness and diameter of the magnetic layer when the magnetic layer is formed of permalloy, has a magnetic anisotropy (Ku) of '0', and has a disk shape;

FIGS. 3 and 4 are schematic perspective views illustrating a magnetization direction of a magnetic layer where a magnetic vortex is formed;

FIG. 5 is a schematic perspective view of a magnetic recording element according to a second preferred embodiment of the present invention;

FIG. 6 is a schematic perspective view of a magnetic recording element according to a third preferred embodiment of the present invention;

FIG. 7 is a schematic perspective view of a magnetic random access memory (MRAM) according to a preferred embodiment of the present invention;

FIG. 8 is a plane view of the MRAM of FIG. 7;

FIG. 9 is another plan view of an MRAM according to a preferred embodiment of the present invention;

FIG. 10 is a schematic perspective view of an MRAM according to another preferred embodiment of the present invention; and FIG. 11 is a schematic perspective view of an MRAM according to still another preferred embodiment of the present invention.

MODE FOR THE INVENTION

Hereinafter, a magnetic recording element and a method for recording information in a nonvolatile magnetic random access memory according to preferred embodiments of the present invention will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a schematic perspective view of a magnetic recording element according to a first preferred embodiment of the present invention.

Referring to FIG. 1, the magnetic recording element 100 according to the first embodiment of the present invention includes a read electrode 110, a magnetic pinned layer 120, an insulating layer 130, a magnetic free layer 140 and drive electrodes 150*a*, 150*b*, 151*a* and 151*b*.

The read electrode 110 is shaped in a plate extending in a direction, and is used for reading information stored in the magnetic recording element 100. The read electrode 110 may be formed of at least one of titanium (Ti), gold (Au), copper (Cu) and aluminum (Al), or a composite thereof. Desirably, the read electrode 110 may be composed of a bilayer of Ti and Au.

The magnetic pinned layer 120 is formed in a plate shape on the read electrode 110. The magnetic pinned layer 120 may be formed in a disk shape. The magnetic pinned layer 120 may be formed of at least one of cobalt (Co), iron (Fe), nickel (Ni), Fe—Ni alloy (i.e., permalloy), Fe—Co (i.e., permendur), Fe—Ni—Co alloy (perminvar), Fe—Ni—Mo alloy (i.e., supermalloy). Desirably, the magnetic pinned layer 120 may be formed of Fe—Ni alloy, which is called 'permalloy'.

The magnetic pinned layer 120 provides a reference magnetization for reading information of the magnetic recording element. In order to provide the reference magnetization, a magnetic vortex or a magnetic single domain having a magnetization state arranged in parallel with a top surface of the magnetic pinned layer 120 may be formed in the magnetic pinned layer 120. The magnetization state formed in the magnetic pinned layer 120 is determined by the shape of the magnetic pinned layer 120. The variation in magnetization state formed in the magnetic layer according to the shape of the magnetic layer is shown in FIG. 2.

FIG. 2 is a graph showing the variation in magnetization state formed in a magnetic layer according to the thickness and diameter of the magnetic layer when the magnetic layer is formed of permalloy, has a magnetic anisotropy (Ku) of '0', and has a disk shape.

As shown in FIG. 2, the magnetization state of the magnetic layer having a disk shape is determined by the diameter and thickness of the magnetic layer. In a magnetic layer having the thickness and diameter corresponding to a region I of FIG. 2, a magnetic single domain having the magnetization state arranged in parallel with a top surface of the magnetic layer is formed. In a magnetic layer having the thickness and diameter corresponding to a region III of FIG. 2, a magnetic single domain having the magnetization state arranged in a direction perpendicular to the top surface of the magnetic layer is formed. In a magnetic layer having the thickness and diameter corresponding to a region II of FIG. 2, a magnetic vortex is formed. While FIG. 2 illustrates a magnetic layer composed of Fe—Ni alloy, other magnetic layers composed of ferromagnetic materials may be used. Even in the case where the magnetic layer does not have a disk shape, the magnetization state of the magnetic layer is determined by the size and thickness of the magnetic layer.

Since the magnetic vortex or the magnetic single domain having the magnetization state arranged in parallel with the top surface of the magnetic pinned layer 120 is formed in the magnetic pinned layer 120, the magnetic pinned layer 120 has the thickness and diameter corresponding to the region I or II of FIG. 2.

The insulating layer 130 is formed on the magnetic pinned layer 120 in the same shape as that of the magnetic pinned layer 120, preferably, in the shape of a disk. The insulating layer 130 is used to read out information of the magnetic recording element. Information stored in the magnetic recording element 100 according to the present invention is read using a magnetoresistance difference obtained by applying a voltage between one of the drive electrodes, e.g., reference numeral 151*a*, and the read electrode 110.

To minimize an error occurring during reading of information, a tunneling magnetoresistance (TMR) effect may be used as one of methods for maximizing the magnetoresistance difference according to the stored information. The insulating layer 130 is formed between the magnetic pinned layer 120 and the magnetic free layer 140 to make use of the TMR effect. Accordingly, the insulating layer 130 is formed of a magnesium oxide (MgO) layer, an aluminum oxide ($Al_2O_3$) layer, a strontium-titanium oxide ($SrTiO_3$, STO) layer, or a composite layer thereof. Desirably, the insulating layer 130 may be formed of magnesium oxide. At this time, the insulating layer 130 is formed in a thickness range of 0.5 nm to 10 nm.

To further increase the TMR difference, a cobalt (Co) thin film or cobalt (Co)-iron (Fe) alloy thin film (not shown) having a thickness of several nanometers may be formed between the magnetic pinned layer 120 and the insulating layer 130, and/or between the magnetic free layer 140 and the insulating layer 130. When the Co—Fe alloy thin film is formed, interfacial properties are improved to thereby increase the TMR difference.

The magnetic free layer 140 is formed on the insulating layer 130 in the same shape as that of the insulating layer 130, preferably, in the shape of a disk. Like the magnetic pinned layer 120, the magnetic free layer 140 is formed of a ferromagnetic material, for example, at least one of Co, Fe, Ni, Fe—Ni alloy, Fe—Co alloy, Fe—Ni—Co alloy, and Fe—Ni—Mo alloy. Desirably, the magnetic free layer 140 may be formed of a Fe—Ni alloy, which is called 'permalloy'. The magnetic free layer 140 is formed so as to have the thickness and diameter corresponding to the region II of FIG. 2.

A magnetization direction of the magnetic free layer 140, which has the thickness and diameter corresponding to region II of FIG. 2 and thus has a magnetic vortex formed therein, are schematically illustrated in FIGS. 3 and 4. A magnetic vortex 310 has a magnetic vortex core 320*a*, 320*b* having a magnetization component perpendicular to the top surface of the magnetic free layer 140 at a central portion of the magnetic free layer 140. The magnetic vortex 310 also has a parallel magnetization 330, which is a magnetization component formed around the magnetic vortex core 320a, 320b and rotating in a direction parallel to the top surface of the magnetic free layer 140. At this time, the core orientation of the magnetic vortex 310 is an upward direction 320a from the top surface of the magnetic free layer 140 as shown in FIG. 3 or is a downward direction 320b from the top surface of the magnetic free layer 140 as shown in FIG. 4. The parallel magnetization 330 formed around the magnetic vortex core 320a, 320b forms a concentric circle centering on the magnetic vortex core 320a, 320b. When the magnetic vortex is formed in the magnetic pinned free layer 120, the direction of the parallel magnetization 330 formed around the magnetic vortex core of the magnetic free layer 140 may be identical to the direction of the parallel magnetization formed around the magnetic vortex core of the magnetic pinned layer 120.

When the magnetic free layer 140 is formed, it is possible to store information according to the core orientation of the magnetic vortex formed in the magnetic free layer 140. That is, it is possible to store information as "1" if the core orientation of the magnetic vortex is an upward direction from the top surface of the magnetic free layer 140, and to store information as "0" if the core orientation of the magnetic vortex is a downward direction from the top surface of the magnetic free layer 140.

Meanwhile, when a current or magnetic field is applied to the magnetic free layer 140, the magnetic vortex core formed in the magnetic free layer 140 rotates on the magnetic free layer 140. Then, if a speed of the magnetic vortex core formed in the magnetic free layer 140 exceeds a critical speed, the core orientation of the magnetic vortex is switched. If the core orientation of the magnetic vortex formed in the magnetic free layer 140 is switched in this manner, new information is recorded in the magnetic recording element 100. That is, information can be recorded in the magnetic recording element 100 by applying a current or magnetic field to the magnetic free layer 140. The applied current or magnetic field is a current or magnetic field of which a direction varies with time. Desirably, the applied current or magnetic field may be a circularly polarized current or a circularly polarized magnetic field.

When a current or magnetic field of which a direction varies clockwise with time is applied, the core orientation of the magnetic vortex can be switched by applying only a low current or magnetic field if the core orientation of the magnetic vortex is the downward direction from the top surface of the magnetic free layer 140. However, if the core orientation of the magnetic vortex is the upward direction from the top surface of the magnetic free layer 140, the core orientation of the magnetic vortex can be switched only if a high current or magnetic field is applied.

On the contrary, when a current or magnetic field of which a direction varies counter-clockwise with time is applied, the core orientation of the magnetic vortex can be switched by applying only a low current or magnetic field if the core orientation of the magnetic vortex is the upward direction from the top surface of the magnetic free layer 140. However, if the core orientation of the magnetic vortex is the downward direction from the top surface of the magnetic free layer 140, the core orientation of the magnetic vortex can be switched only if a high current or magnetic field is applied.

Compared to the case of applying a current or magnetic field of which a direction does not vary with time, the core orientation of the magnetic vortex can be switched to a desired direction by the use of the above characteristics, and thus a current or magnetic field of which a direction varies with time may be applied.

The rotation direction of the parallel magnetization 330 formed around the magnetic vortex core 320a, 320b does not vary. To convert the rotation direction of the parallel magnetization 330, a current or magnetic field with higher energy should be applied in comparison with a current or magnetic field applied to switch the core orientation of the magnetic vortex 320a, 320b.

To read out information recorded as "0" or "1", a current or magnetic field of which a direction varies with time, for example, a circularly current or a circularly magnetic field, is applied to the magnetic free layer 140 to rotate the magnetic vortex core formed in the magnetic free layer 140. Information stored in the magnetic recording element 100 is read through a magnetoresistance difference resulting from a relative difference in parallel magnetization between the magnetic free layer 140 and the magnetic pinned layer 120, which dynamically varies according to the rotation of the magnetic vortex core formed in the magnetic free layer 140.

When the magnetic vortex is formed in the magnetic pinned layer 120, the magnetic vortex formed in the magnetic pinned layer 120 may be affected by the current or magnetic field applied to rotate the magnetic vortex core formed in the magnetic free layer 140. For example, when a current or magnetic field is applied to rotate the magnetic vortex core formed in the magnetic free layer 140, the rotation radius of the magnetic vortex core formed in the magnetic pinned layer 140 can be increased. This leads to a decrease in a magnetoresistance difference, which makes it difficult to read information recorded in the magnetic recording element 100. Therefore, although the current or magnetic field is applied to rotate the magnetic vortex core formed in the magnetic free layer, it is preferable that there is no great variation in parallel magnetization formed in the magnetic pinned layer 120 to attain a distinct magnetoresistance difference.

Meanwhile, since power consumption can be reduced when a low current or magnetic field is applied to record or read information, the magnetic recording element 100 can be driven with low cost if applying the low current or magnetic field. To this end, it is preferable to apply a current or magnetic field having a frequency equal to the eigenfrequency of the magnetic vortex formed in the magnetic free layer 140. When a current or magnetic field having a frequency equal to the eigenfrequency of the magnetic vortex is applied, the magnetic vortex core moves at a faster speed and with a greater rotation radius even using a relatively low current or magnetic field, compared to the case of applying current or magnetic field having a frequency differing from the eigenfrequency. The eigenfrequency ($v_0$) of the magnetic vortex is defined as the following Equation 1:

Equation:

$$v_0 = \frac{1}{4\pi} \gamma M_s \frac{\xi^2}{\chi(0)} \qquad \text{(Equation 1)}$$

where $M_s$ is a saturation magnetization of the magnetic layer, $\chi(0)$ is an initial susceptibility, $\gamma$ is a gyromagnetic ratio, and $\xi$ is a proportional constant. Since the gyromagnetic ratio and the proportional constant are constant values regardless of the forming material and shape of the magnetic layer, the eigenfrequency of the magnetic vortex is inversely proportional to the initial susceptibility of the magnetic layer in which the magnetic vortex is formed and is proportional to the saturation magnetization. The initial susceptibility is determined by the shape of the magnetic layer, and the saturation magnetization is determined by the forming material of the magnetic layer.

In the result, a current or magnetic field applied when recording or reading information in the magnetic recording element 100 may have the same frequency as the eigenfrequency of the magnetic vortex formed in the magnetic free layer 140. At this time, the magnetic vortex core formed in the magnetic pinned layer 120 also moves if the magnetic vortex is formed in the magnetic pinned layer 120. However, if the magnetic pinned layer 120 and the magnetic free layer 140 are formed such that the magnetic vortex formed in the magnetic pinned layer 120 differs in eigenfrequency from the magnetic vortex formed in the magnetic free layer 140, the current or magnetic field applied to rotate the magnetic vortex core formed in the magnetic free layer 140 slightly affects the magnetic pinned layer 120. Therefore, it is preferable that the magnetic vortex formed in the magnetic pinned layer 120 differs in eigenfrequency from the magnetic vortex formed in the magnetic free layer 140.

To make the eigenfrequency of the magnetic vortex formed in the magnetic free layer 140 differ from that of the magnetic vortex formed in the magnetic pinned layer 140, the magnetic free layer 140 should differ in at least one of the initial susceptibility and the saturation magnetization from the magnetic pinned layer 120 as described above. The initial susceptibility is related to the shape of the magnetic layer, and the saturation magnetization value is related to a material forming the magnetic layer. Accordingly, if the magnetic free layer 140 differs in at least one of material, thickness and diameter from the magnetic pinned layer 120, the magnetic vortex formed in the magnetic pinned layer 120 differs in eigenfrequency from the magnetic vortex formed in the magnetic free layer 140. In particular, the thicknesses of the magnetic free layer 140 and the magnetic pinned layer 120 may differ from each other because the thickness control is easy and simple.

Alternatively, an exchange bias my be used in order that a current or magnetic field applied to rotate the magnetic vortex core formed in the magnetic free layer 140 may slightly affect the magnetic pinned layer 120. To use the exchange bias, an antiferromagnetic layer (not shown) may be formed under the magnetic pinned layer 120. The antiferromagnetic layer has an exchange coupling with the magnetic pinned layer at an interface therebetween. The eigenfrequency of the magnetic vortex formed in the magnetic pinned layer 120 may differ from that of the magnetic vortex formed in the magnetic free layer 140 by virtue of this coupling force. A material forming the antiferromagnetic layer may include at least one of Fe—Mn alloy, Fe—Mn—Rh alloy, Fe—Ni—Mn alloy, $Fe_2N$, $Fe_2O_3$, $FeF_2$, FeS, Ir—Mn alloy, Ni—Mn alloy, NiO, CoO, CoN, C—Mn alloy, Co—Cr alloy, MnO, $Cr_2O_3$, Cr—Mn alloy, Cr—Mn—Pt alloy, Pt—Mn alloy, Pd—Mn alloy, and Pd—Pt—Mn alloy.

Meanwhile, when a magnetic single domain having a magnetization state arranged in parallel with a top surface of the magnetic pinned layer 120 is formed in the magnetic pinned layer 120, the magnetic single domain of the magnetic pinned layer 120 is affected only if a current or magnetic field with a very high intensity is applied. Therefore, only the intensity of the current or magnetic field, which is applied to switch the core orientation of the magnetic vortex formed in the magnetic free layer 140 or allows the magnetic vortex core to rotate, does not have a sufficient effect on the magnetic single domain of the magnetic pinned layer.

Even when a magnetic single domain having a magnetization state arranged in parallel with a top surface of the magnetic pinned layer 120 is formed in the magnetic pinned layer 120, an exchange bias may also be used to suppress the effect upon the magnetic pinned layer 120. To this end, an antiferromagnetic layer (not shown) may be formed under the magnetic pinned layer 120, as described above. The antiferromagnetic layer prevents the structure of the magnetic single domain having a magnetization state arranged in parallel with the top surface of the magnetic pinned layer 120 from being changed due to an external current or magnetic field. A material forming the antiferromagnetic layer may include at least one of Fe—Mn alloy, Fe—Mn—Rh alloy, Fe—Ni—Mn alloy, $Fe_2N$, $Fe_2O_3$, $FeF_2$, FeS, Ir—Mn alloy, Ni—Mn alloy, NiO, CoO, CoN, Co—Mn alloy, Co—Cr alloy, MnO, $Cr_2O_3$, Cr—Mn alloy, Cr—Mn—Pt alloy, Pt—Mn alloy, Pd—Mn alloy, and Pd—Pt—Mn alloy.

The drive electrodes 150a, 150b, 151a and 151b are formed in a plate shape extending in a direction. The drive electrodes 150a, 150b, 151a and 151b may be composed of at least one of titanium, gold, copper and aluminum, or a composite layer thereof. Desirably, the drive electrodes 150a, 150b, 151a and 151b may be composed of a bilayer of titanium and gold. Of the drive electrodes 150a, 150b, 151a and 151b, the drive electrodes 150a and 150b form a drive electrode pair and the drive electrodes 151a and 151b form another drive electrode pair. The drive electrodes 150a, 150b, 151a and 151b are formed at intervals of 90° in a circumferential direction of the magnetic free layer 140. The drive electrodes 150a, 150b, 151a and 151b and the magnetic free layer 140 are disposed so as to form an ohmic contact therebetween.

Therefore, when a voltage is applied to the drive electrode pairs 150 and 151, a current flows through the magnetic free layer 140. Such a configuration of the drive electrodes 150a, 150b, 151a and 151b is directed to applying a time-variant current, desirably, a circularly polarized current. That is, when sine- or cosine-wave AC voltages having the same frequency and amplitude but a phase difference of 90° are applied to the drive electrode pairs 150 and 151, a circularly polarized current is applied to the magnetic free layer 140.

Although the drive electrodes 150a, 150b, 151a and 151b are formed at intervals of 90° in a circumferential direction of the top surface of the magnetic free layer 140, the present invention is not limited thereto. For instance, all the drive electrodes 150a, 150b, 151a and 151b may be formed at different angles other than 90° in a circumferential direction of the magnetic free layer 140. Alternatively, the drive electrodes 150a, 150b, 151a and 151b may be disposed at side portions so as to form an ohmic contact with the magnetic free layer 140, or three or more drive electrode pairs may be formed so as to form an ohmic contact with the magnetic free layer 140.

While it is described that the magnetic recording element 100 according to the present invention includes the insulating layer 130 between the magnetic pinned layer 120 and the magnetic free layer 140 and thus uses the TMR effect so as to read information stored in the magnetic recording element 100, the present invention is not limited thereto. For example, the magnetic recording element 100 may include a conductive layer instead of the insulating layer.

The conductive layer is also formed between the magnetic pinned layer 120 and the magnetic free layer 140 in the same shape as that of the magnetic pinned layer 120, e.g., desirably in the shape of a disk. The conductive layer is provided for using giant magnetoresistance (GMR) effect by increasing a magnetoresistance difference when information stored in the magnetic recording element 100 is read. Accordingly, the conductive layer may be formed of at least one of titanium, gold, copper and aluminum showing good GMR effect, and a composite thereof. Desirably, the conductive layer may be formed of copper. Like the case of employing the insulating layer, to maximize the magnetoresistance difference, a cobalt thin film or a cobalt-iron alloy thin film (not shown) of several nanometers in thickness maybe formed between the magnetic pinned layer 120 and the conductive layer, and/or between the magnetic free layer 140 and the conductive layer.

FIG. 5 is a schematic perspective view of a magnetic recording element according to a second preferred embodiment of the present invention.

Referring to FIG. 5, the magnetic recording element 400 according to the second embodiment of the present invention includes a read electrode 410, a magnetic pinned layer 420, an insulating layer 430, a magnetic free layer 440 and drive electrodes 450 and 451.

The read electrode 410, the magnetic pinned layer 420, the insulating layer 430, and the magnetic free layer 440 correspond to the read electrode 110, the magnetic pinned layer 120, the insulating layer 130 and the magnetic free layer 140 included in the magnetic recording element 100 illustrated in FIG. 1, respectively. In the magnetic recording element 400 of FIG. 5, information is also stored in a core orientation of a magnetic vortex formed in the magnetic free layer 440.

The drive electrodes 450 and 451 included in the magnetic recording element 400 of FIG. 5 may be formed in plurality such that they cross each other while covering a central portion of the top surface of the magnetic free layer 440. Desirably, the two drive electrodes 450 and 451 are disposed so as to cross each other at a right angle. The drive electrodes 450 and 451 may be composed of at least one of titanium, gold, copper and aluminum, or a composite layer thereof. Desirably, the drive electrodes 150a, 150b, 151a and 151b may be composed of a bilayer of titanium and gold. When a current is applied the drive electrodes 450 and 451, a magnetic field is applied to the magnetic free layer 440.

Although the embodiment of FIG. 5 shows and describes that the drive electrodes 450 and 451 cross each other at 90° while covering the central portion of the top surface of the magnetic free layer 440, the present invention is not limited thereto. For example, one drive electrode may be disposed on the magnetic free layer 440 and the other drive electrode may be disposed beneath the magnetic free layer 440. In addition, the two drive electrodes 450 and 451 may be formed in a configuration to cross each other not at an angle of 90° but at a different angle other than 90°, or may be disposed in a configuration to cover not the central portion but a peripheral portion of the magnetic free layer 440. Also, while the embodiment of FIG. 5 shows and describes that number of the drive electrodes are two, the present invention is not limited thereto. For example, three or more drive electrodes may be formed on or beneath the magnetic free layer 140 in a configuration to cross each other.

Like the first embodiment, the magnetic recording element 400 in FIG. 5 may include a conductive layer using the GMR effect instead of the insulating layer 430 using the TMR effect. The conductive layer included in the magnetic recording element 400 in FIG. 5 corresponds to the conductive layer described in the first embodiment.

FIG. 6 is a schematic perspective view of a magnetic recording element according to a third preferred embodiment of the present invention.

Referring to FIG. 6, a magnetic recording element 500 according to the third embodiment of the present invention includes a magnetic free layer 540, drive electrodes 550a, 550b, 551a and 551b, and a read line 510.

The magnetic free layer 540 and the drive electrodes 550a, 550b, 551a and 551b included in the magnetic recording element 500 of FIG. 6 respectively correspond to the magnetic free layer 140 and the drive electrodes 150a, 150b, 151a and 151b included in the magnetic recording element 100 in FIG. 1. In the magnetic recording element 500 of FIG. 6, information is also stored in a core orientation of a magnetic vortex formed in the magnetic free layer 540.

The read line 510 included in the magnetic recording element 500 of FIG. 6 extends in a direction and disposed around the magnetic free layer 540. When a predetermined voltage is applied to the magnetic free layer 540 through the drive electrodes 550a, 550b, 551a and 551b, the magnetic vortex core formed in the magnetic free layer 540 moves. The movement of the magnetic vortex core causes a magnetic field generated according to the position of a magnetic vortex core to be varied, thus generating an induced voltage in the read line 510.

A rotation radius of the magnetic vortex formed in the magnetic free layer 540 differs depending on information stored in the magnetic recording element 500 when a voltage is applied to the drive electrodes 550a, 550b, 551a and 551b to read information. This difference in the rotation radius causes a variation in magnetic field around the magnetic free layer 540 to differ according to information stored in the magnetic recording element 500. Resultantly, since the induced voltage generated in the read line 510 changes its magnitude and variation amount as the variation in magnetic field differs, it is possible to detect information stored in the magnetic recording element 500 by measuring the current flowing through the read line 510.

The magnitude of the voltage induced by the movement of the magnetic vortex formed in the magnetic free layer 540 is in inverse proportion to the width of the read line 510. Accordingly, to increase the induced voltage, the width of the read line 510 may be equal to or smaller than the diameter of the magnetic free layer 540.

When the width of the read line 510 is smaller than the diameter of the magnetic free layer 540, the read line 510 may be spaced apart from the center of the magnetic free layer 540. This is because the magnetic vortex formed in the magnetic free layer 540 moves only at one side of the read line 510 when a rotation radius of the magnetic vortex formed in the magnetic free layer 540 is small. By virtue of the above-described configuration, a difference in the induced voltage according to the rotation radius of the magnetic vortex formed in the magnetic free layer 540 becomes greater.

While the third embodiment describes that the drive electrodes 550a, 550b, 551a and 551b are disposed to form an ohmic contact with the magnetic free layer 540 in the magnetic recording element 500, the drive electrodes having the configuration of the second embodiment may be formed on or beneath the magnetic free layer 540. In this case, however, a current is supplied through the drive electrode to thereby apply a magnetic field to the magnetic free layer 540 so that the magnetic vortex core formed in the magnetic free layer 540 rotates.

FIG. 7 is a schematic perspective view of a magnetic random access memory (MRAM) 2900 according to a preferred embodiment of the present invention, and FIG. 8 is a plane view of the MRAM of FIG. 7.

Referring to FIGS. 7 and 8, the MRAM 2900 according to the present invention includes an array of the magnetic recording elements 100 of FIG. 1 arranged in rows and columns.

The respective magnetic recording elements 100 are connected to each other through drive electrodes 150a, 150b, 151a and 151b formed on a magnetic free layer 140, and a read electrode 110 formed under a magnetic pinned layer 120. The drive electrodes 150a, 150b, 151a and 151b are composed of four electrodes. Of the four drive electrodes 150a, 150b, 151a and 151b, two electrodes 150a and 150b facing each other form one electrode pair 150, and the other two electrodes 151a and 151b facing each other form another electrode pair 151. The read electrode 110 is composed of a single electrode, and extends in a direction between the drive electrode pairs 150 and 151. That is, the read electrode 110 is disposed at an angle of 45° with respect to the two drive electrode pairs 150 and 151. At this time, the read electrodes 110 are disposed in the same direction.

The respective magnetic recording elements form an array by sharing the drive electrode and the read electrode with the magnetic recording elements adjacent thereto. For example, the drive electrode indicated by reference numeral 150b of the drive electrodes 150a, 150b, 151a and 151b included in the magnetic recording element indicated by reference numeral 100 is connected to the magnetic recording element indicated by reference numeral 101. Therefore, the magnetic recording elements indicated by reference numeral 100 and 101 share the drive electrode indicated by reference numeral 150b. Likewise, the magnetic recording elements indicated by reference numerals 100 and 102 share the drive electrode indicated by reference numeral 151b. The read electrode 110 included in the magnetic recording element indicated by reference numeral 100 is connected to the magnetic recording element indicated by reference numeral 103 that is the second closest one. That is, the magnetic recording elements indicated by reference numerals 100 and 103 share the read electrode indicated by reference numeral 110.

By virtue of the MRAM 2900 having the above structure, the adjacent magnetic recording elements 101, 102 and 103 are little affected by a current or magnetic field applied to a specific magnetic recording element 100, which is selected to store and read information, using the two drive electrodes 150 and 151 and the read electrode 110. Furthermore, when information is recorded or read in an MRAM using the MRAM 2900 having the structure of FIGS. 7 and 8, it is easy to select a specific magnetic recording element from where information is to be recorded or read.

In addition to the configuration of the magnetic recording elements 100 illustrated in FIGS. 7 and 8 to form the MRAM, an MRAM 3200 having another configuration of FIG. 9 can also be realized. Referring to FIG. 9, the MRAM 3100 is configured such that the read electrode 110 is connected to the closest magnetic recording element 104, and the drive electrode 150b is connected to the second closest magnetic recording element 105.

The magnetic recording element 100 of the MRAM 2900, 3100 should exhibit the same characteristics regardless of its location. To be specific, the magnetic recording element 100 should exhibit the same response to a current or magnetic field applied to store, record and read information. Therefore, the magnetic free layer 140, the insulating layer 130, the magnetic pinned layer 120 and the read electrode 110 in one magnetic recording element 100 should have the same shape and thickness, and be formed of the same material as those of another magnetic recording element 100.

In particular, the MRAM 2900, 3100 is configured such that the magnetic vortexes formed in the magnetic free layers 140 included in all the magnetic recording elements of the MRAM 2900, 3100 should have the same eigenfrequency. Furthermore, the MRAM 2900, 3100 may be configured such that the rotation direction of the parallel magnetization, which is arranged in parallel with the top surface of the magnetic free layer and formed around the magnetic vortex core formed in the magnetic free layer 140, should be the same in all the magnetic recording elements.

The magnetic vortex core may be formed in the magnetic pinned layer 120 included in the magnetic recording element 100 of the MRAM 2900, 3100, as described above. The core orientation of the magnetic vortex formed in the magnetic pinned layer 120 is the same in all the magnetic recording elements. The magnetic pinned layer 120 is also formed such that the magnetic vortex formed in the magnetic pinned layer 120 has a frequency equal to the eigenfrequency of the magnetic vortex. Also, the MRAM 2900, 3100 may be configured such that the rotation direction of the parallel magnetization arranged around the magnetic vortex core of the magnetic pinned layer 120 and rotating in parallel with the top surface of the magnetic pinned layer 120 is also the same in all the magnetic recording elements. The rotation direction of the parallel magnetization may also be the same as the rotation direction of the parallel magnetization arranged in parallel with the top surface of the magnetic free layer 140 around the magnetic vortex core formed in the magnetic free layer 140. The reason is to minimize an error that may occur during reading of information, and to achieve distinct differences of characteristics measured during reading of information.

However, as described above, the magnetic vortex core formed in the magnetic pinned layer 120 should not move easily although a current or magnetic field is applied to move the magnetic vortex core formed in the magnetic free layer 140. Therefore, the eigenfrequency of the magnetic vortex core formed in the magnetic free layer 140 should differ from that of the magnetic vortex core formed in the magnetic pinned layer 120.

In addition, a magnetic single domain having a magnetization state arranged in parallel with the top surface of the magnetic pinned layer may be formed in the magnetic pinned layer included in the magnetic recording element of the MRAM 2900, 3100. The magnetic single domain should have the same magnetization direction in all magnetic recording elements. The reason is also to minimize an error that may occur during reading of information, and to achieve distinct differences of characteristics measured during reading of information.

While the above embodiments show and describe the MRAM 2900, 3100 including the insulating layer, the present invention is not limited thereto. For example, the MRAM 2900, 3200 may include a conductive layer instead of the insulating layer, which is also similar to the above. A plurality of drive electrode pairs more than the two drive electrode pairs 150 and 151 may be in ohmic contact with the magnetic free layer 140, and four electrodes forming the two drive electrode pairs 150 and 151 may be formed at intervals of 90° in a circumferential direction of the magnetic free layer 140.

FIG. 10 is schematic perspective view of an MRAM 3200 according to another preferred embodiment of the present invention.

A magnetic recording element forming the MRAM 3200 of FIG. 10 is the magnetic recording element 400 of FIG. 5. That is, in the MRAM 3200 of FIG. 10, the magnetic recording elements 400 of FIG. 5 are arranged in rows and columns, and the respective magnetic recording elements 400 form an array so as to share the drive electrodes 450 and 451 and the read electrode 410 with the magnetic recording elements 400 adjacent thereto. The MRAM 3200 of FIG. 10 only differs in the drive electrode structure from the MRAM 2900 of FIGS. 7 and 8, and other parts correspond to those of the MRAM 2900 of FIGS. 7 and 8. The drive electrodes 450 and 451 of the MRAM 3200 of FIG. 10 are disposed on the magnetic free layer 440 in a configuration to cross each other at a right angle. As illustrated in FIGS. 7 and 8, the drive electrodes 450 and 451 connect the closet magnetic recording elements, and the read electrode 410 connects the second closest magnetic recording elements.

The MRAM including an array of the magnetic recording elements 400 of FIG. 5 arranged in rows and columns has not only a configuration of FIG. 10, but also another configuration where the read electrode 410 is connected to the closest magnetic recording element and the drive electrodes are connected to the second closest magnetic recording elements. Number of the drive electrodes may be three or more. Even though the number of the drive electrodes is two, both the two drive electrodes may be formed under the magnetic free layer 440 or formed on and beneath the magnetic free layer, respectively, which differs from the configuration of FIG. 10. The magnetic recording elements may cross each other at an angle other than 90°.

Like the MRAMs 2900 and 3200 shown in FIGS. 7 and 9, the magnetic recording element 400 of the MRAM 3200 in FIG. 10 should exhibit the same characteristics regardless of its location. To be specific, the magnetic recording element 400 of the MRAM 3200 should exhibit the same response to a current or magnetic field applied to store, record and read information. Therefore, the read electrode 410, the magnetic free layer 440, the insulating layer 430, the magnetic pinned layer 420 and the drive electrodes 450 and 451 in the magnetic recording elements 400 of the MRAM 3200 should respectively have the same shape and thickness, and be formed of the same material in all the magnetic recording elements.

In particular, the MRAM 3200 is configured such that the magnetic vortexes formed in the magnetic free layers 440 included in all the magnetic recording elements of the MRAM 3200 may have the same eigenfrequency. Furthermore, the MRAM 3200 is configured such that the rotation direction of the parallel magnetization arranged in parallel with the top surface of the magnetic free layer 440 is the same in all the magnetic recording elements.

The magnetic vortex core may be formed in the magnetic pinned layer 420 included in the magnetic recording element 400 of the MRAM 3200. The magnetic pinned layer 420 is formed such that the core orientation of the magnetic vortex formed in the magnetic pinned layer 420 is the same in all the magnetic recording elements. The magnetic vortexes formed in the magnetic pinned layer 420 also have the same eigenfrequency in all the magnetic recording elements. Also, the MRAM 3200 may have a configuration that the rotation direction of the parallel magnetization arranged parallel with the top surface of the magnetic pinned layer 420 and arranged around the magnetic vortex core of the magnetic pinned layer 420 is also the same in all the magnetic recording elements. The rotation direction of the parallel magnetization may also be the same as the rotation direction of the parallel magnetization arranged in parallel with the top surface of the magnetic free layer 440 around the magnetic vortex core formed in the magnetic free layer 440. The reason is to minimize an error that may occur during reading of information, and to achieve distinct differences of characteristics measured during reading of information.

However, as described above, the magnetic vortex core formed in the magnetic pinned layer 420 should not move easily although a current or magnetic field is applied to move the magnetic vortex core formed in the magnetic free layer 440. Therefore, the eigenfrequency of the magnetic vortex core formed in the magnetic free layer 440 should differ from that of the magnetic vortex core formed in the magnetic pinned layer 420.

In addition, a magnetic single domain having a magnetization state arranged in parallel with the top surface of the magnetic pinned layer may be formed in the magnetic pinned layer included in the magnetic recording element of the MRAM 3200. The magnetic single domain should have the same magnetization direction in all magnetic recording elements. The reason is also to minimize an error that may occur during reading of information, and to achieve distinct differences of characteristics measured during reading of information.

FIG. 11 is a schematic perspective view of an MRAM 3300 used in a method for read-out of information according to still another embodiment of the present invention.

The magnetic recording element included in the MRAM 3300 of FIG. 11 is the magnetic recording element 500 shown in FIG. 6. That is, the MRAM 3300 of FIG. 11 has such a configuration that the magnetic recording elements 500 of FIG. 6 are arranged in rows and columns, and the respective magnetic recording elements 500 form an array so as to share the drive electrodes 550a, 550b, 551a and 551b and the read line 510 with the magnetic recording elements adjacent thereto. The MRAM 3300 of FIG. 11 is similar to the MRAM 2900 of FIG. 7. However, the MRAM 3300 of FIG. 11 is configured with the magnetic recording elements 500 and each of the magnetic recording elements 500 includes the read line 510 that is disposed around the magnetic free layer 540 and electrically insulated, instead of the read line 110 included in the magnetic recording element 100 of FIG. 7. In addition, the MRAM 3300 of FIG. 11 does not need the magnetic pinned layer 110 and the insulating layer 130 provided in the magnetic recording element 100 of FIG. 7.

The read line 510 of the magnetic recording element 500 included in the MRAM 3300 of FIG. 11 is formed to read information. That is, as described above, an induced voltage is generated by the rotation of the magnetic vortex core formed in the magnetic free layer 540, and information is thus read through a current flowing through the read line 510 due to the induced voltage. The induced voltage generated by the rotation of the magnetic vortex core formed in the magnetic free layer 540 is not generated at both terminals of the read line 510 but generated spatially. Therefore, an undesired current may flow through the read line 510 due to the induced voltage generated in a magnetic recording element which is not a magnetic recording element to be read out during the application of the current or magnetic field. Consequently, the read line 510 may be formed spatially far in a direction between the drive electrodes 550a, 550b, 551a and 551b so as to reduce an error that may occur during the read operation.

Like the MRAMs 2900, 3100 and 3200 illustrated in FIGS. 7, 8 and 9, each of the magnetic recording elements 500 in the MRAM 3300 of FIG. 11 should exhibit the same characteristics regardless of its location. To be specific, the magnetic recording elements 500 should exhibit the same response to a current or magnetic field applied to store, record and read information. Therefore, the read line 510, the magnetic free layer 540 and the drive electrodes 550a, 550b, 551a and 551b should respectively have the same shape and thickness, and be formed of the same material in all the magnetic recording elements.

In particular, the magnetic vortexes formed in the magnetic free layers 540 included in all the magnetic recording elements of the MRAM 3300 should have the same eigenfrequency. Furthermore, the MRAM 3300 should be configured such that the rotation directions of the parallel magnetization arranged in parallel with the top surface of the magnetic free layer 540 around the magnetic vortex core formed in the magnetic free layer 540 should be the same in all the magnetic recording elements.

Although the magnetic recording element 500 of the MRAM 3300 in FIG. 11 has a configuration that the drive electrodes 550a, 550b, 551a and 551b are disposed to form an ohmic contact with the magnetic free layer 540, it may have another configuration that drive electrodes having the same configuration as the drive electrodes 450 and 451 in the magnetic recording element 400 of the MRAM 3200 of FIG. 11 are formed on a top surface or an undersurface of the magnetic free layer 540. In this case, a current is supplied through the drive electrodes 450 and 451 to apply a magnetic field to the magnetic free layer 540, and resultantly the magnetic vortex core formed in the magnetic free layer 540 is rotated.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A magnetic recording element comprising:
a read electrode;
a magnetic pinned layer formed on the read electrode;
an insulating layer formed on the magnetic pinned layer;
a magnetic free layer formed on the insulating layer, in which a magnetic vortex is formed; and
a plurality of drive electrode pairs disposed to form an ohmic contact with the magnetic free layer to apply a current of which a direction varies clockwise or counterclockwise with time in order to rotate the core orientation of the magnetic vortex,
wherein the plurality of drive electrode pairs comprise two drive electrode pairs, and four drive electrodes forming the two drive electrode pairs are shaped in a plate extending in a direction and are formed at intervals of 90° in a circumferential direction of the magnetic free layer,
wherein two drive electrodes of the four drive electrodes facing each other form one drive electrode pair, and the other two drive electrodes of the four drive electrodes facing each other form another drive electrode pair.

2. The magnetic recording element of claim 1, wherein a magnetic vortex is formed in the magnetic pinned layer.

3. The magnetic recording element of claim 1, further comprising an antiferromagnetic layer formed of an antiferromagnetic material under the magnetic pinned layer, wherein a magnetic single domain having a magnetization state arranged in parallel with a top surface of the magnetic pinned layer is formed in the magnetic pinned layer.

4. The magnetic recording element of claim 1, further comprising a cobalt thin film or a cobalt-iron alloy thin film in between the magnetic pinned layer and the insulating layer, and/or between the insulating layer and the magnetic free layer.

5. A magnetic random access memory (MRAM) comprising magnetic recording elements arranged in rows and columns, the magnetic recording element comprising: a read electrode; a magnetic pinned layer formed on the read electrode; an insulating layer formed on the magnetic pinned layer; a magnetic free layer formed on the insulating layer, in which a magnetic vortex is formed; and a plurality of drive electrode pairs disposed to form an ohmic contact with the magnetic free layer, wherein the respective magnetic recording elements form an array by sharing the drive electrode pairs and the read electrode with the magnetic recording elements adjacent thereto.

6. The MRAM of claim 5, wherein the plurality of drive electrode pairs comprise two drive electrode pairs, and four drive electrodes forming the two drive electrode pairs are shaped in a plate extending in a direction of the adjacent magnetic recording element and are formed at intervals of 90° in a circumferential direction, wherein two drive electrodes of the four drive electrodes facing each other form one drive electrode pair, and the other two drive electrodes of the four drive electrodes facing each other form another drive electrode pair.

* * * * *